United States Patent [19]

Fujihira

[11] Patent Number: 5,162,966
[45] Date of Patent: Nov. 10, 1992

[54] SEMICONDUCTOR DEVICE HAVING A SURGE PROTECTING ELEMENT

[75] Inventor: Tatsuhiko Fujihira, Kanagawa, Japan

[73] Assignee: Fuji Electric Co., Ltd., Kanagawa, Japan

[21] Appl. No.: 719,933

[22] Filed: Jun. 24, 1991

[30] Foreign Application Priority Data

Jul. 6, 1990 [JP] Japan .................. 2-178908

[51] Int. Cl.⁵ .................. H01L 29/78; H01L 29/90; H02H 3/22
[52] U.S. Cl. .................. 257/140; 361/100; 361/101; 257/328; 257/360; 257/363
[58] Field of Search ............... 357/23.13, 13; 361/100, 361/101

[56] References Cited

U.S. PATENT DOCUMENTS 4,061,928 12/1977 Kessler .................. 357/23.13

4,858,055 8/1989 Okitaka .................. 357/23.13

FOREIGN PATENT DOCUMENTS 1289281 11/1989 Japan .................. 357/23.13

Primary Examiner—Jerome Jackson, Jr.
Attorney, Agent, or Firm—Finnegan, Henderson, Farabow, Garrett and Dunner

[57] ABSTRACT

A MOSFET semiconductor device has a surge protecting element comprising a transistor element having a gate electrode, a source electrode, and a drain electrode. A Zener diode having a cathode electrode and an anode electrode is connected to the drain electrode of the transistor element. A lateral MOSFET element has a gate electrode and a drain electrode connected to the anode electrode of the Zener diode, a source electrode connected to the gate electrode of the transistor element, and a back gate electrode connected to the source electrode of the transistor element.

10 Claims, 2 Drawing Sheets

SEMICONDUCTOR DEVICE HAVING A SURGE PROTECTING ELEMENT

BACKGROUND OF THE INVENTION

A. Field of the Invention

The present invention relates to a MOSFET semiconductor device having a semiconductor element and a dynamic clamp circuit integrated thereinto, and a control electrode for controlling a current between a pair of major electrodes of the device.

B. Description of the Prior Art

A dynamic clamp circuit is used in a circuit coupled with a inductive load (e.g., a solenoid), to absorb a surge voltage generated by the energy in the inductive load when the current is abruptly shut off. FIG. 1 is a circuit diagram showing such a dynamic clamp circuit, as described in M. Glogolia and M. Jihanyi, Conference Record, IEEE Industrial Application Society Annual Meeting, pp. 429 to 433 (1986).

In FIG. 1, when a power MOSFET $Q_0$ 20 is turned off, a gate terminal G is set at the same potential as a source terminal S. The surge voltage generated in the inductive load (not shown) is applied to a terminal D connected to the drain of MOSFET $Q_0$ 20. A pair of Zener diodes $Z_1$ 21 and $Z_2$ 22 are connected back-to-back between terminal D and a gate resistor $R_G$. Gate resistor $R_G$ is connected between gate terminal G and the gate electrode of MOSFET $Q_0$ 20.

In this circuit configuration, if the Zener voltage $V_{Z1}$ (of Zener diode $Z_1$ 21) is slightly lower than the breakdown voltage of MOSFET $Q_0$ 20, when the potential at drain terminal D reaches the potential $V_{Z1}$, Zener diode $Z_1$ 21 breaks down to allow the current to flow through a route of from D to $Z_1$ to $Z_2$ to $R_G$ to G. As a result, MOSFET $Q_0$ 20 is turned on, and the urge voltage is absorbed.

When gate electrode G is at a positive potential, the current flows through a route of from G to $R_G$ to $Z_1$ 21 to D (in the absence of Zener diode $Z_2$ 22, and the potential at the gate electrode will not increase. To avoid this, Zener diode $Z_2$ 22 is provided. The circuit will operate similarly if MOSFET $Q_0$ 20 is replaced by a power semiconductor device (e.g., an IGBT or a bipolar transistor) operating under the control of the current flowing to the gate electrode or the base electrode.

FIG. 2 is a cross-sectional view of a dynamic clamp circuit portion of FIG. 1 integrated into a semiconductor chip. The semiconductor chip contains a power vertical MOSFET. In FIG. 2, the semiconductor chip includes a Zener diode group $Z_1$ which comprises a plurality of Zener diodes $Z_{1-1}$ through $Z_{1-n}$, and a Zener diode $Z_2$. Each Zener diode consists of a p+ anode layer 3, which is formed simultaneously with the p-well (not shown) of the MOSFET (not shown), and an n+ cathode layer 4 in the surface region of p+ anode layer 3, which is formed simultaneously with the n+ source layer (not shown) of the MOSFET. p+ anode layer 3 and n+ cathode layer 4 are formed in the surface region of an n− epitaxial layer 1, to serve as a drift layer on an n+ substrate 2. n+ substrate 2 is in contact with a drain electrode 12 of the MOSFET.

n+ cathode layer 4 of Zener diode $Z_2$ is connected to the gate electrode (not shown) of the MOSFET via a wire 61. Wire 61 contacts cathode layer 4 through an opening in an interlayer insulating film 52 which covers a field oxide film 51. p+ anode layer 3 of Zener diode $Z_2$ is connected to p+ anode layer 3 of Zener diode $Z_{1-1}$, via a wire 62. Each pair of adjacent Zener diodes $Z_{1-1}$ and $Z_{1-n}$ in Zener diode group $Z_1$, n+ cathode layer 4 and p+ anode layer 3 are interconnected via a wire 63.

In FIG. 2, the first Zener diode $Z_{1-1}$ and the last Zener diode $Z_{1-n}$ in order of sequence in Zener diode group $Z_1$, are shown. Other Zener diodes between these two are not shown for simplicity. n+ cathode layer 4 of the last Zener diode $Z_{1-n}$ at one end of Zener diode group $Z_1$ is connected to an n+ contact layer 41 via wire 64, and also connected to drain electrode 12 through n− drift layer 1 and n+ substrate 2.

The above structure of FIG. 2 having the conventional dynamic clamp circuit integrated into the semiconductor chip containing a vertical MOSFET has a problem in that the breakdown voltage of the chip decreases with respect to that of the MOSFET because of formation of a parasitic bipolar transistor in the chip: the emitter of the parasitic transistor constituted by n+ cathode layer 4 of Zener diode $Z_2$; the base by a p+ anode layer; and the collector by n− drift layer 1 and n+ substrate 2.

In the structure of FIG. 2, when the MOSFET is turned off, the gate and source terminals of the MOSFET are placed at an equal ground potential; n+ cathode layer 4 is also grounded; and n+ substrate 2 in contact with drain electrode 12 is set at a power source potential. Under this condition, the breakdown voltage of the chip is equal to the collector-emitter breakdown voltage $V_{CEO}$. The breakdown voltage of the vertical MOSFET is substantially equal to the breakdown voltage between n− layer 1 and the p+-well, which is formed simultaneously with anode layers 3 of Zener diodes $Z_1$ and $Z_2$ (i.e., the voltage $V_{CBO}$ of the parasitic transistor). The relationship between the breakdown voltages $V_{CEO}$ and $V_{CBO}$ is generally given $$V_{CEO} \approx 0.5 \text{ to } 0.7 \times V_{CBO}.$$

In other words, the breakdown voltage of the chip is determined by $V_{CEO}$ and approximately equal to 0.5 to 0.7 times the breakdown voltage of the vertical MOSFET. Therefore, when the breakdown voltage of the vertical MOSFET is 130 V, for example, the chip breakdown voltage is 80 V.

SUMMARY OF THE INVENTION

An object of the present invention is to provide a semiconductor device having a high breakdown voltage and providing sufficient protection against surge voltages, which breakdown voltage does not decrease on account of the various semiconductor elements integrated in the device.

The MOSFET semiconductor device according to an embodiment of the invention comprises a transistor element having a gate electrode, a source electrode, and a drain electrode; a Zener diode having a cathode electrode connected to the drain electrode of the transistor element and an anode electrode; a lateral MOSFET element having a gate electrode and a drain electrode connected to the anode electrode of the Zener diode, a source electrode connected to the gate electrode of the transistor element, and a back gate electrode connected to the source electrode of the transistor element.

Further, the MOSFET semiconductor device includes a semiconductor substrate of a first conductivity type, and the lateral MOSFET element includes a first region of a second conductivity type in the surface of the semiconductor substrate; second and third regions of the first conductivity type in the surface of the first region and laterally spaced from one another; a gate insulating layer overlying the first region between the second and third region and at least partially the second and third regions; and the gate electrode of the lateral MOSFET element overlying the gate insulating layer.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 3:
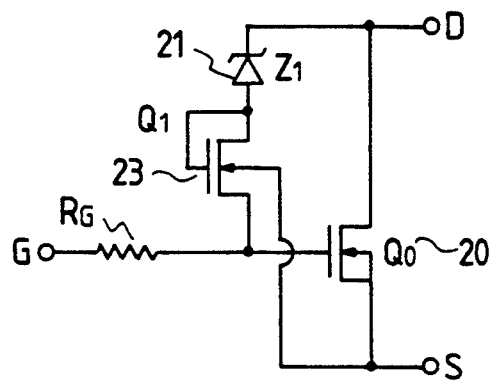
FIG. 3 is a circuit diagram of a MOSFET having a dynamic clamp circuit according to an embodiment of the present invention.

Referring to FIG. 3, a Zener diode $Z_1$ 21 and a MOSFET $Q_1$ 23 are connected in series between a juncture between the gate electrode of a MOSFET $Q_0$ 20 and a gate resistor $R_G$, and a drain terminal D of MOSFET $Q_0$ 20. The gate electrode of MOSFET $Q_1$ 23 is connected to the anode of Zener diode $Z_1$ 21, and the back gate of MOSFET $Q_1$ 23 is connected to a source terminal S of MOSFET $Q_0$ 20.

In this circuit configuration, when the potential at drain terminal D reaches the Zener voltage $VZ_1$ (of Zener diode $Z_1$ 21), Zener diode $Z_1$ 21 breaks down and the voltage at drain terminal D is applied to the gate of the MOSFET $Q_1$ 23 via Zener diode $Z_1$ 21. Consequently, MOSFET $Q_1$ 23 is turned on, and the current is allowed to flow through a route of from D to $Z_1$ to $Q_1$ to $R_G$ to G. Further, when MOSFET $Q_1$ 23 is turned on, the potential at the gate terminal G becomes higher than that at drain terminal D, causing MOSFET $Q_1$ 23 to be turned on, and consequently the potential at the gate electrode of MOSFET $Q_0$ 20 rises.

Figure 4:
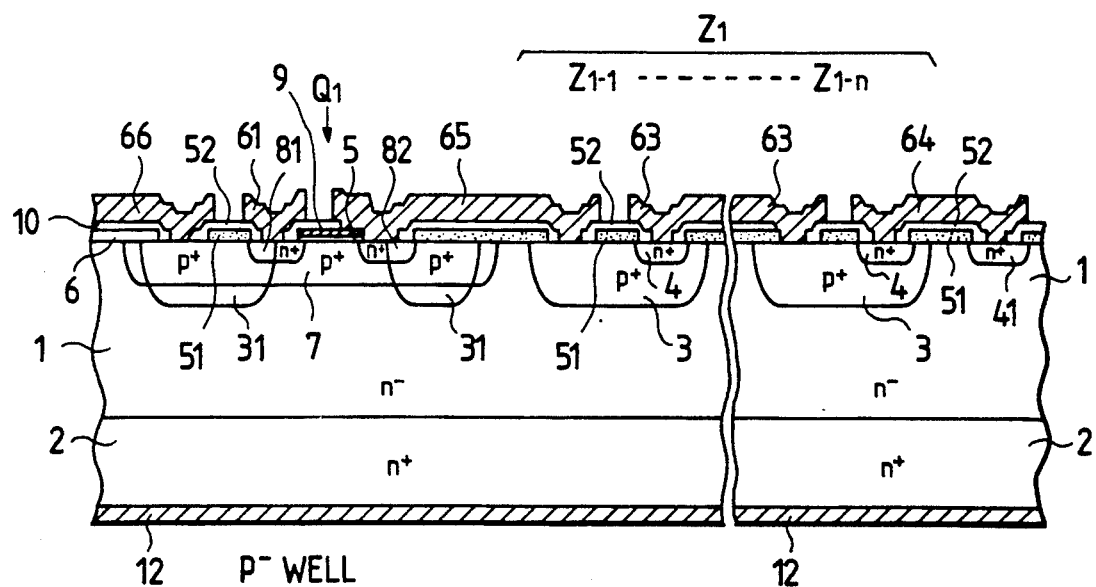
FIG. 4 is a cross sectional view of a dynamic clamp circuit integrated into a semiconductor chip containing a vertical MOSFET, according to an embodiment of the present invention.

FIG. 4 is a cross sectional view of a dynamic clamp circuit, which is integrated into a semiconductor chip containing a power vertical MOSFET, and functionally equivalent to the circuit diagram of FIG. 3. The power vertical MOSFET (not shown) is fabricated into the semiconductor chip. In FIG. 4, the same reference numerals and characters are used to designate the same or equivalent portions in FIG. 3.

Figure 2:
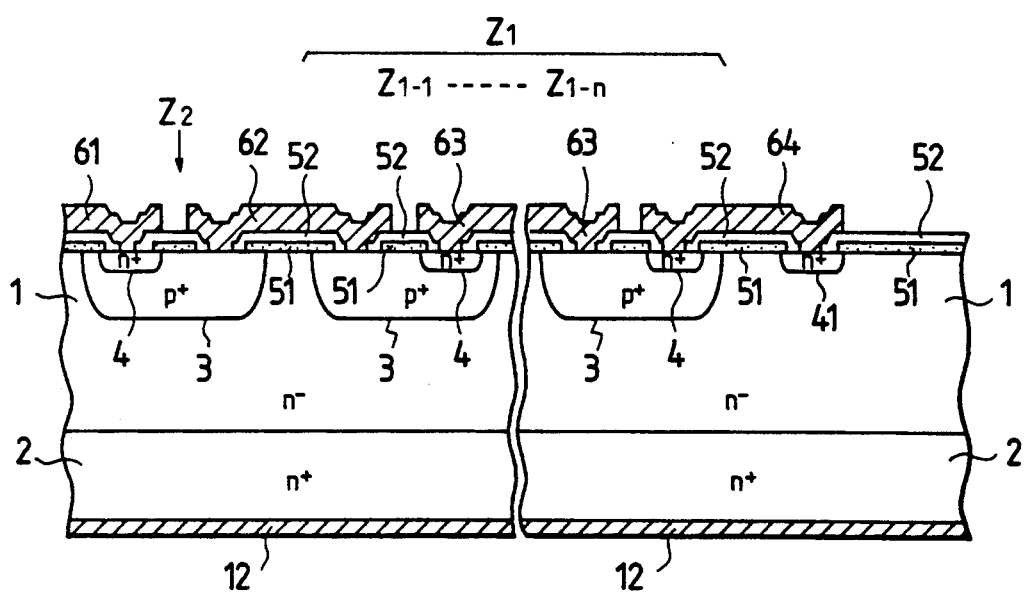
FIG. 2 is a cross sectional view of a conventional dynamic clamp circuit portion of FIG. 1 integrated into a semiconductor chip containing a vertical MOSFET.

Referring to FIG. 4, a lateral MOSFET $Q_1$ is formed in place of Zener diode $Z_2$ of FIG. 2, which the substrate region is a p$^-$ well 7 formed in the surface region of an n$^-$ layer 1. Lateral MOSFET $Q_1$ is functionally equivalent to transistor $Q_1$ in FIG. 3.

Lateral MOSFET $Q_1$ in FIG. 4 includes n$^+$ layers 81 and 82 as source and drain regions, respectively, and a gate electrode 9 on a gate oxide film 5. Gate oxide film 5 is formed on the surface of p$^-$ well 7 laterally extending to n$^+$ layers 81 and 82. n$^+$ layer or source region 81 of MOSFET $Q_1$ is connected to the gate electrode (not shown) of a vertical MOSFET (not shown) by a wire 61. Gate electrode 9 and n$^+$ layer or drain region 82 of MOSFET $Q_1$ are connected to a p$^+$ anode layer 3 of a Zener diode $Z_{1-1}$ by a wire 65.

p$^-$ well 7 is connected to the source electrode (not shown) of the vertical MOSFET by a wire 66 as a back gate electrode, and the back gate electrode is in contact with a p$^+$ well 31. n$^+$ cathode layer 4 of Zener diode $Z_{1-n}$ at one end of Zener diode group $Z_1$ is connected to drain electrode 12, n$^+$ contact layer 41, n$^-$ drift layer 1, and n$^+$ substrate 2, via a wire 64, as in FIG. 2.

Figure 5:
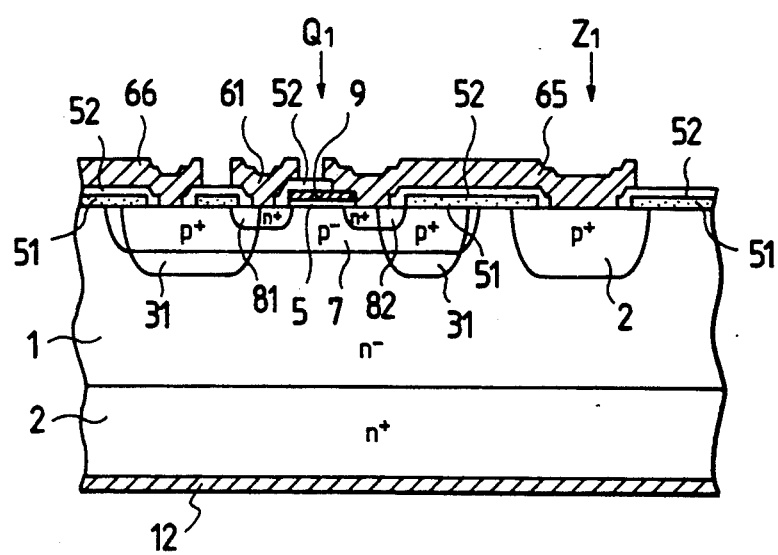
FIG. 5 is a cross sectional view of a dynamic clamp circuit integrated into a semiconductor chip, containing a vertical MOSFET according to another embodiment of the present invention.

FIG. 5 is a cross sectional view of a dynamic clamp circuit portion integrated into a semiconductor chip having a vertical MOSFET, according to another embodiment of the present invention. In FIG. 5, the same reference numerals and characters are used to designate the same or equivalent portions in FIG. 4. The clamp circuit of the present embodiment may be manufactured using the same manufacturing method as for the structure in FIG. 4.

The dynamic clamp circuit, embodied herein and shown in FIG. 5, includes a single Zener diode $Z_1$ of a vertical structure, instead of a plurality of Zener diodes as in FIG. 4. The anode of Zener diode $Z_1$, is a p$^+$ layer 32, which is formed simultaneously with p$^+$ well 31 of lateral MOSFET $Q_1$, and the cathode of Zener diode $Z_1$ is constituted by n$^-$ drift layer 1 and n$^+$ substrate 2. Gate electrode 9 and n$^+$ drain region 82 of lateral $Q_1$, as in FIG. 4, are connected to p$^+$ anode layer 32 of Zener diode $Z_1$ via wire 65. n$^+$ substrate 2, which serves in conjunction with n$^-$ draft layer 1 as the cathode of Zener diode $Z_1$, is connected to drain electrode 12 of vertical MOSFET $Q_0$.

In this case, the Zener voltage $V_{Z1}$ (of Zener diode $Z_1$) is determined by the thickness of n$^-$ layer 1 and the depth of p$^+$ layer 31; and may be set high; allowing, the single Zener diode $Z_1$, rather than a plurality of Zener diodes connected in series as in FIG. 4, to provide sufficient protection.

Figure 1:
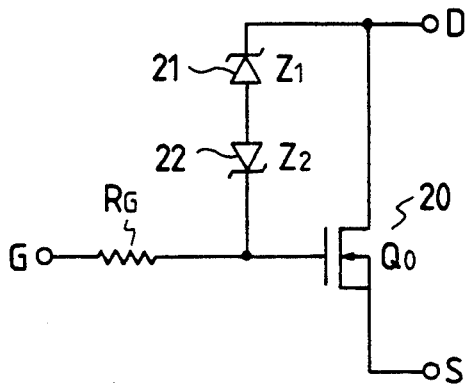
FIG. 1 is a circuit diagram of a MOSFET having a conventional dynamic clamp circuit.

The semiconductor chip containing the dynamic clamp circuit of the above embodiments (of FIGS. 4 and 5) have a 125 V breakdown voltage at a maximum. This breakdown voltage of the chip is close to the approximately 130 V breakdown voltage of power MOSFET $Q_0$ 20 integral in the chip, and is approximately 1.5 times that of the conventional chip of FIG. 1 or 2.

The semiconductor chip of the above embodiments may be manufactured in the following process steps in sequence. In reference to FIG. 4, (a) n$^-$ drift layer 1 of a 3 Ω-cm resistance and a 12 μm thickness is epitaxially grown on n$^+$ substrate 2 of a 0.01 Ω-cm resistance and a 500 μm thickness;

(b) p$^+$ anode layers 3 of Zener diode $Z_1$ and p$^+$ wells 31 are formed simultaneously with the vertical MOSFET corresponding to MOSFET transistor $Q_0$ shown in FIG. 3, by photolithography, ion implantation of boron at $5 \times 10^{14}/cm^2$ of dosage, and high temperature heat treatment at 1100° C. for 2 hours in that order;

(c) p$^-$ well 7 is formed by photolithography, ion implantation of boron at $5 \times 10^{13}/cm^2$ of dosage, and high temperature heat treatment at 1100° C. for 2 hours. In this step, a p$^-$ well for a drive circuit and a control circuit, both of which may be integrated into the structure, and the dynamic clamp circuit may also be formed;

(d) a field oxide film 51 of 1 μm thick is formed by thermal oxidation; then, contact openings are formed in oxide film 51 by photolithography;

(e) gate oxide film 5 of lateral MOSFET $Q_1$ of a 550 Å thickness and the gate oxide film of vertical MOSFET $Q_0$, are formed by thermal oxidation process;

(f) polycrystalline silicons are deposited over the structure by CVD, for example; then phosphoruses are diffused thereinto, and unnecessary portions of the diffused polycrystalline silicon are removed by photolithography, to form gate electrode 9 and the gate electrode of vertical MOSFET $Q_0$;

(g) the p base of the vertical MOSFET $Q_0$ is formed by photolithography, ion implanation of boron, and heat treatment;

(h) $n^+$ cathode layer 4 of Zener diode $Z_1$, source region 81 and drain region 82 of the lateral MOSFET $Q_1$, $n^+$ contact layer 41 and the $n^+$ source layer are formed by photolithography and ion implantation of phosphorous of $1 \times 10^{16}/cm^2$ of dosage;

(i) an interlayer insulating film 52 made of phosphorous glass is deposited by CVD; then contact openings are formed by photolithography;

(j) an Al-Si alloy is vapor deposited, and patterned by photolithography, to form the electrodes of lateral MOSFET $Q_0$ and wires 61, 63, 64, 65, and 66; and (k) metals are vapor deposited over the surface of the structure opposite the MOSFET, to form the drain electrode of vertical MOSFET $Q_0$, and a common electrode 12.

According to the embodiments of the present invention, referring to FIG. 3, a junction between the source electrode of lateral MOSFET $Q_1$ which is connected to a control electrode G through gate resistor $R_G$, vertical MOSFET $Q_0$ and a region of lateral MOSFET $Q_1$, which is connected to the first major electrode (i.e., corresponds to source electrode S in FIG. 3) formed on the same major surface of the substrate having control electrode G thereon, constitutes the base-emitter junction of a parasitic bipolar transistor, and is always reversely biased. Therefore, the parasitic bipolar transistor will not operate, and hence the breakdown voltage of the chip will not decrease relative to that of vertical MOSFET $Q_0$ integral therein, the breakdown voltage up to $V_{CBO}$ can be secured.

Further, since the gate and drain electrodes of lateral MOSFET $Q_1$ are connected to the anode region of Zener diode $Z_1$, when Zener diode $Z_1$ breaks down, lateral MOSFET $Q_1$ is turned on; the portion between the second major electrode (i.e., corresponds to drain electrode D in FIG. 3) and the gate electrode of lateral MOSFET $Q_1$ becomes conductive; the dynamic clamp circuit becomes operative; and then vertical MOSFET $Q_0$ is turned on. In this situation, if a voltage is applied to control electrode G and the gate voltage of lateral MOSFET $Q_1$ falls below a threshold voltage, lateral MOSFET $Q_1$ is turned off and the portion between the gate electrode and the second major electrode become nonconductive.

As discussed above, in the conventional dynamic clamp circuit (shown in FIG. 1) a pair of Zener diodes are connected back-to-back between the control electrode and the first major electrode of the vertical MOSFET. The dynamic clamp circuit of the embodiments of the present invention is significantly different in that one of the two zener diodes in the conventional circuit, which is connected to the control electrode is replaced with a lateral MOSFET.

This inventive feature in the chip maintains the parasitic bipolar transistor in the chip reverse biased; thus makes the parasitic transistor inoperative. Therefore, the breakdown voltage of the chip of the present invention is close to the breakdown voltage of the vertical MOSFET integral therein. Further, the above embodiments of the present invention can protect not only the vertical MOSFET integrated in the chip but also bipolar transistors and IGBTs from the surge voltages generated when the current in the inductance load is shut off.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A MOSFET semiconductor device having means for voltage surge protection, said device comprising:
   a transistor element having a gate electrode, a source electrode, and a drain electrode;
   Zener diode means having an anode electrode and a cathode electrode, the cathode electrode being connected to said drain electrode of the transistor element;
   a lateral MOSFET element having a gate electrode and a drain electrode connected to said anode electrode of the Zener diode, a source electrode connected to the gate electrode of the transistor element, and a back gate electrode connected to the source electrode of said transistor element.

2. The MOSFET semiconductor device of claim 1, wherein said device includes a semiconductor substrate of a first conductivity type, and wherein said lateral MOSFET element includes:
   a first region of a second conductivity type in the surface of said semiconductor substrate;
   second and third regions of the first conductivity type in the surface of the first region and laterally spaced from one another;
   a gate insulating layer overlying the first region between the second and third region and at least partially the second and third regions; and
   said gate electrode of the lateral MOSFET element overlying said gate insulating layer.

3. The MOSFET semiconductor device of claim 1, wherein said transistor element includes a vertical MOSFET element.

4. The MOSFET semiconductor device of claim 1, wherein said transistor element includes a bipolar transistor.

5. The MOSFET semiconductor device of claim 1, wherein said transistor element includes an insulated gate bipolar transistor.

6. The MOSFET semiconductor device of claim 1, wherein said Zener diode means includes a plurality of Zener diodes connected in series.

7. The MOSFET semiconductor device of claim 1, further comprising:
   a control electrode; and
   a resistor coupled between said control electrode and the gate electrode of said transistor element.

8. The MOSFET semiconductor device of claim 2, wherein said second region is coupled to the source electrode of the lateral MOSFET and said third region is coupled to the drain electrode of the lateral MOSFET.

9. The MOSFET semiconductor device of claim 2, wherein said first region is coupled to said back gate electrode of the lateral MOSFET element.

10. The MOSFET semiconductor device of claim 2, wherein said lateral MOSFET further includes one or more fourth regions of the second conductivity type in the surface of the semiconductor substrate and laterally within the first region, and said fourth region contacts the first region.

* * * * *